(12) United States Patent
Okahisa et al.

(10) Patent No.: US 11,231,149 B2
(45) Date of Patent: Jan. 25, 2022

(54) LIGHT-EMITTING DEVICE, ILLUMINATION DEVICE, AND METHODS FOR MANUFACTURING SAME

(71) Applicant: NICHIA CORPORATION, Anan (JP)

(72) Inventors: Tsuyoshi Okahisa, Tokushima (JP); Tomohito Shinomiya, Anan (JP); Daizo Kiba, Itano-gun (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/024,430

(22) Filed: Sep. 17, 2020

(65) Prior Publication Data

US 2021/0088190 A1 Mar. 25, 2021

(30) Foreign Application Priority Data

Sep. 19, 2019 (JP) .............................. JP2019-170634

(51) Int. Cl.
*F21K 9/69* (2016.01)
*F21K 9/90* (2016.01)
*G02B 5/18* (2006.01)
*F21V 17/16* (2006.01)
*F21V 17/06* (2006.01)
(Continued)

(52) U.S. Cl.
CPC ............. *F21K 9/69* (2016.08); *B29C 45/0053* (2013.01); *F21K 9/90* (2013.01); *F21V 5/045* (2013.01); *F21V 17/06* (2013.01); *F21V 17/16* (2013.01); *G02B 5/1876* (2013.01); *B29C 2045/0079* (2013.01); *F21Y 2115/10* (2016.08)

(58) Field of Classification Search
CPC ......... F21K 9/69; F21K 9/90; B29C 45/0053; F21V 5/045; F21V 17/06; F21V 17/16; G02B 5/1876
See application file for complete search history.

(56) References Cited

U.S. PATENT DOCUMENTS

2006/0291245 A1* 12/2006 Shimada ................... F21V 5/04
362/612
2008/0198604 A1* 8/2008 Kim ................... G02B 19/0028
362/293
(Continued)

FOREIGN PATENT DOCUMENTS

CN 202403094 U 8/2012
CN 103162164 A 6/2013
(Continued)

*Primary Examiner* — Bryon T Gyllstrom
*Assistant Examiner* — Christopher E Dunay
(74) *Attorney, Agent, or Firm* — Foley & Lardner LLP

(57) ABSTRACT

A light-emitting device includes: a substrate; a light-emitting element disposed on the substrate; a light-transmissive member disposed on a light extraction surface of the light-emitting element; and a cover that covers the light-emitting element with a gap between the cover and the light-emitting element, the cover including: an upper portion that is transmissive to light coming from the light-emitting element, a sidewall extending along a peripheral edge of the upper portion and having an outer lateral surface on which a projected portion is formed, and a recess defined by the upper portion and the sidewall. The projected portion is formed of a material that is deformable due to a pressing force generated in the event of an engagement with a counterpart member.

30 Claims, 9 Drawing Sheets

(51) Int. Cl.
   *F21V 5/04* (2006.01)
   *B29C 45/00* (2006.01)
   *F21Y 115/10* (2016.01)

(56) References Cited

U.S. PATENT DOCUMENTS

| | | | |
|---|---|---|---|
| 2010/0328958 A1* | 12/2010 | Zhang | H01L 33/58 362/311.02 |
| 2011/0228528 A1* | 9/2011 | Yang | F21K 9/27 362/235 |
| 2012/0063143 A1* | 3/2012 | Park | F21V 5/045 362/277 |
| 2013/0223064 A1* | 8/2013 | Lee | F21V 29/717 362/235 |
| 2017/0067621 A1* | 3/2017 | Anselm | F21S 8/026 |
| 2021/0071837 A1* | 3/2021 | Owoc | F21V 5/045 |
| 2021/0071843 A1* | 3/2021 | Palm | G02B 19/0028 |
| 2021/0091271 A1 | 3/2021 | Okahisa et al. | |

FOREIGN PATENT DOCUMENTS

| | | |
|---|---|---|
| CN | 203348992 U | 12/2013 |
| JP | 2008-071651 A | 3/2008 |
| JP | 2009-176579 A | 8/2009 |
| JP | 2010-040801 A | 2/2010 |
| JP | 2010-103404 A | 5/2010 |
| JP | 2012-099358 A | 5/2012 |
| JP | 2013-120646 A | 6/2013 |
| JP | 2015-128025 A | 7/2015 |
| JP | 2015-216217 A | 12/2015 |
| JP | 2017-027914 A | 2/2017 |
| JP | 2017-045698 A | 3/2017 |

\* cited by examiner

LIGHT-EMITTING DEVICE, ILLUMINATION DEVICE, AND METHODS FOR MANUFACTURING SAME

CROSS-REFERENCE TO RELATED APPLICATION

The present application claims priority under 35 U.S.C. § 119 to Japanese Patent Application No. 2019-170634, filed Sep. 19, 2019, the disclosure of which is herein incorporated by reference in its entirety.

BACKGROUND

The present disclosure relates to a light-emitting device, an illumination device, and methods for manufacturing them.

Japanese Patent Publication No. 2010-103404 discloses an illumination device including an LED element, a package with lead electrodes on which the LED element is mounted, a cover member attached to the package and having a light-transmissive part. Japanese Patent Publication No. 2010-040801 discloses a light-emitting device including: an LED lamp including an LED element mounted on a circuit board and sealed by a resin; and a cover having a light focusing means that focuses light emitted from the LED element.

SUMMARY

There is room for improvement in reducing a thickness of the above-described devices.

An object of certain embodiments described in the present disclosure is to provide a light-emitting device and an illumination device that can be reduced in thickness, and to provide methods for manufacturing them.

A light-emitting device according to an embodiment of the disclosure includes: a substrate; a light-emitting element disposed on the substrate; a light-transmissive member disposed on a light extraction surface of the light-emitting element; and a cover that covers the light-emitting element with a gap between the cover and the light-emitting element. The cover comprises an upper portion that is transmissive to light coming from the light-emitting element, a sidewall extending along a peripheral edge of the upper portion and having an outer lateral surface on which a projected portion is formed, and a recess defined by the upper portion and the sidewall. The projected portion is formed of a material that is deformable due to a pressing force generated in the event of an engagement with a counterpart member.

A light-emitting device according to an embodiment of the disclosure includes: a substrate; a light-emitting element disposed on the substrate; a light-transmissive member disposed on a light extraction surface of the light-emitting element; and a cover that covers the light-emitting element with a gap between the cover and the light-emitting element. The cover comprises an upper portion that is transmissive to light coming from the light-emitting element, a sidewall extending along a peripheral edge of the upper portion and having an outer lateral surface on which a projected portion is formed, and a recess defined by the upper portion and the sidewall. The sidewall comprises an internal part and an outer part encapsulating the internal part. The projected portion is made of a material that is deformable due to a pressing force generated in the event of an engagement with a counterpart member. The internal part is formed of a hard material harder than the material of the projected portion.

An illumination device according to an embodiment of the disclosure includes: one of the above-described light-emitting devices; and a casing having a through-hole, the casing being the counterpart member. The light-emitting device is fixed to the casing by the projected portion of the light-emitting device being in contact with an inner surface of the through-hole of the casing in a state of being deformed.

A method for manufacturing a light-emitting device according to an embodiment of the disclosure includes: forming a cover, which comprises: injecting a light-transmissive material into a space defined in a molding device, and hardening or curing the injected light-transmissive material, wherein the formed the cover comprises an upper portion, a sidewall extending along a peripheral edge of the upper portion and having an outer lateral surface on which a projected portion is formed, and a recess defined by the upper portion and the sidewall; disposing a light-transmissive member on a light extraction surface of a light-emitting element to be disposed on a substrate; and disposing the cover so that the light-emitting element is housed in the recess. The projected portion is formed of a material that is deformable due to a pressing force generated in the event of an engagement with a counterpart member.

A method for manufacturing an illumination device according to an embodiment of the present disclosure includes: providing a light-emitting device using the above-described method for manufacturing a light emitting device; and fixing the light-emitting device to a casing having a through-hole and constituting the counterpart member so that the projected portion of the light-emitting device comes into contact with an inner surface of the through-hole of the casing in a state of being deformed.

Light-emitting devices and illumination devices according to the present disclosure can be reduced in thickness thereof.

Methods for manufacturing a light-emitting device according to the present disclosure and methods for manufacturing an illumination device according to the present disclosure allow for reducing the thicknesses of the light-emitting device and illumination device to be manufactured.

BRIEF DESCRIPTION OF THE DRAWINGS

A more complete appreciation of embodiments of the invention and many of the attendant advantages thereof will be readily obtained by reference to the following detailed description when considered in connection with the accompanying drawings.

DETAILED DESCRIPTION

Figure 1A:
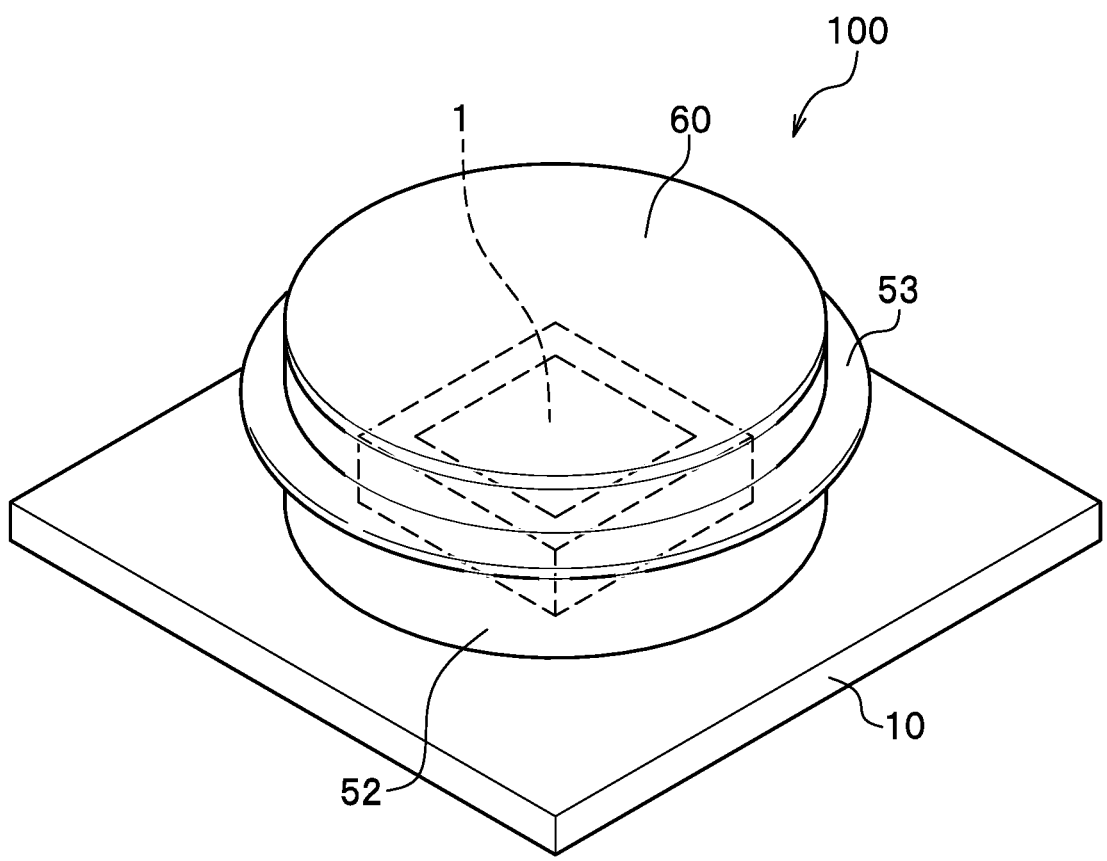
FIG. 1A is a perspective view schematically illustrating the structure of the light-emitting device according to a first embodiment.

Hereinafter, a description will be given of light-emitting devices and illumination devices and manufacturing methods thereof according to embodiments of the present disclosure. It should be appreciated, however, that the embodiments described below are illustrations of light-emitting devices and illumination devices and methods for producing them to give a concrete form to technical ideas of the disclosure, and the present invention is not specifically limited to the embodiments described below. Unless otherwise specified, the dimensions, materials, shapes, relative positions, and the like of the constituent components described in the embodiments below are not intended to limit the scope of the invention thereto, and are merely illustrative. Furthermore, the sizes, positional relations, and so forth of the constituent members shown in the drawings may be exaggerated for the sake of clarity. In the following description, members that are the same or analogous are given the same name or reference sign, and duplicative detailed descriptions are appropriately omitted.

First Embodiment

Light-Emitting Device

Figure 1B:
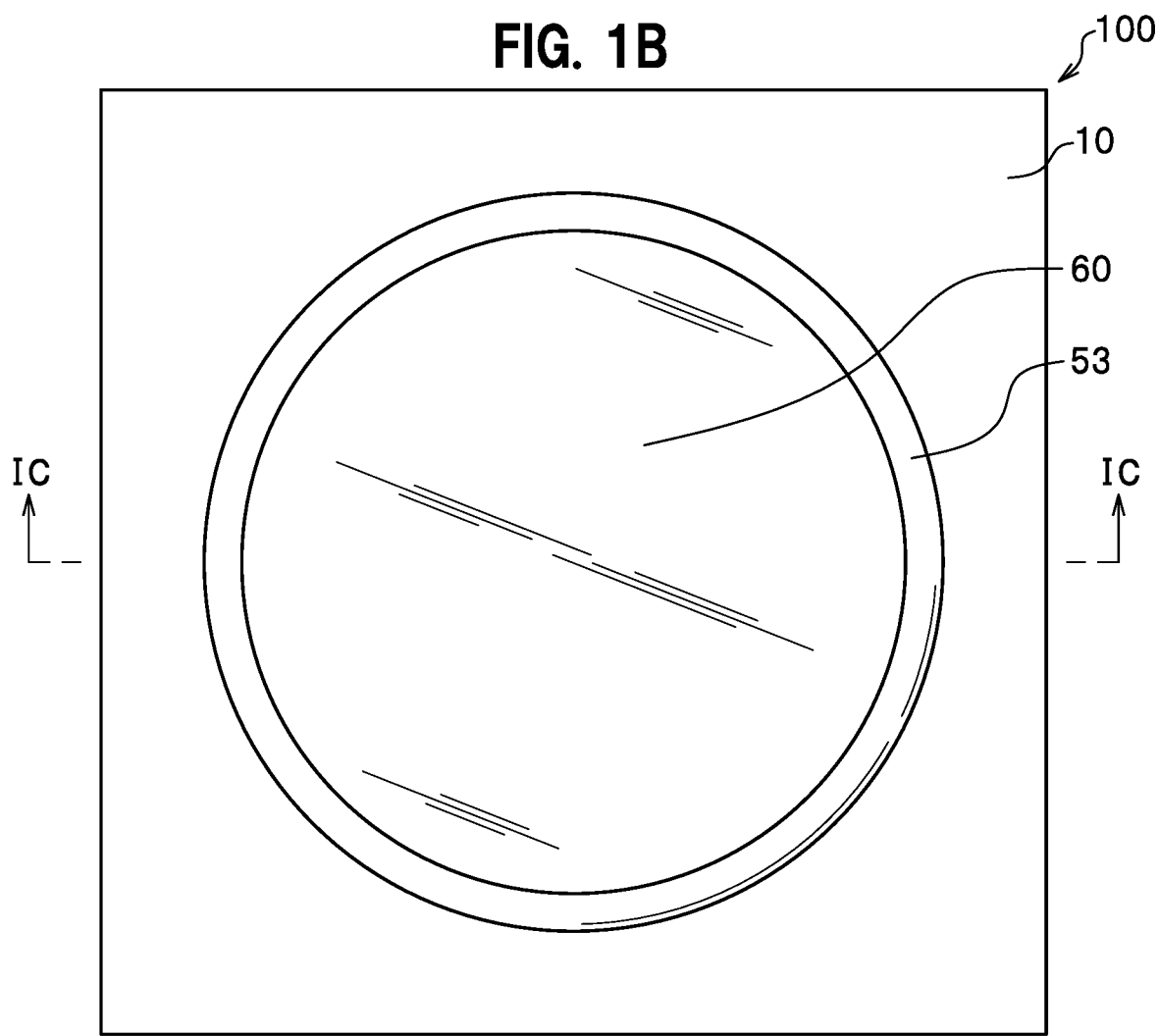
FIG. 1B is a plan view schematically illustrating the structure of the light-emitting device according to the first embodiment.
Figure 1C:
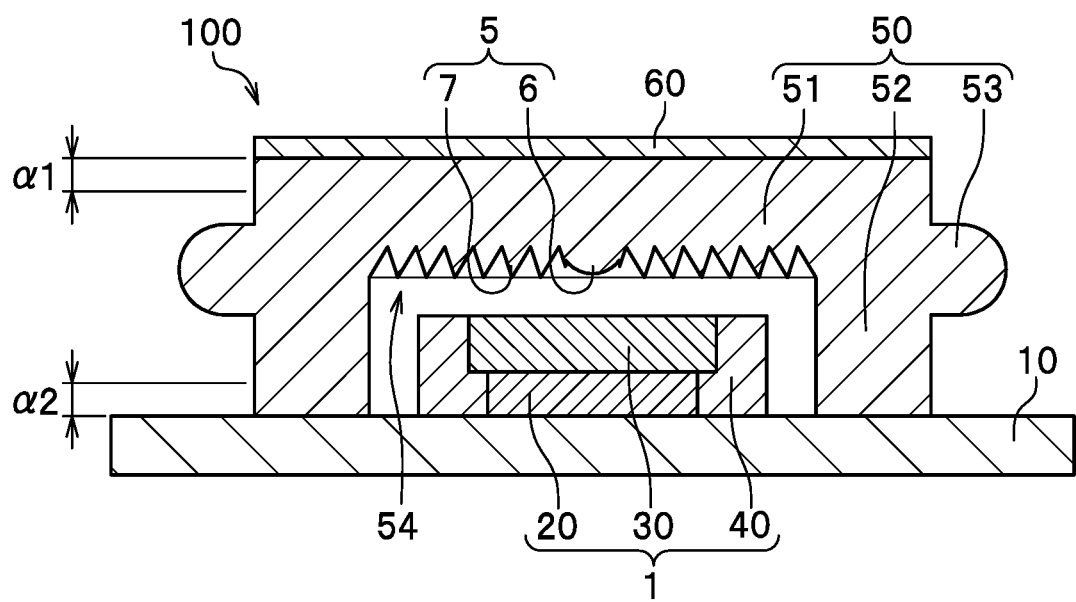
FIG. 1C is a schematic cross-sectional view taken along line IC-IC in FIG. 1B.
Figure 1D:
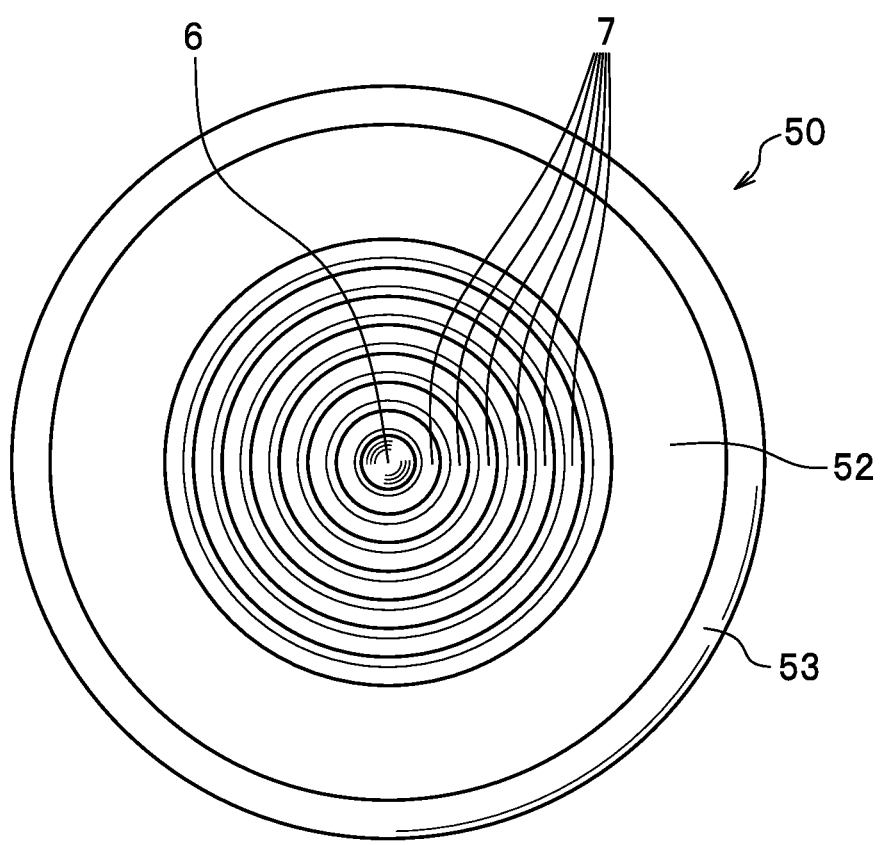
FIG. 1D is a plan view of an upper portion of a cover of the light-emitting device according to the first embodiment, as seen from a side of the cover facing a light-emitting element of the light-emitting device.

FIG. 1A is a perspective view schematically illustrating the structure of the light-emitting device according to a first embodiment. FIG. 1B is a plan view schematically illustrating the structure of the light-emitting device according to the first embodiment. FIG. 1C is a schematic cross-sectional view taken along line IC-IC in FIG. 1B. FIG. 1D is a plan view of an upper portion of a cover of the light-emitting device according to the first embodiment, as seen from a side of the cover facing a light-emitting element of the light-emitting device.

The light-emitting device 100 according to the first embodiment includes: a substrate 10; a light-emitting element 20 disposed on the substrate 10; a light-transmissive member 30 disposed on a light extraction surface of the light-emitting element 20; a cover 50 that covers the light-emitting element 20 with a gap between the cover and the light-emitting element. The cover 50 includes an upper portion 51 which is transmissive to the light coming from the light-emitting element 20; a sidewall 52 extending along a peripheral edge of the upper portion 51 and having an outer lateral surface on which a projected portion 53 is formed; and a recess 54 whose bottom is defined by the upper portion 51 and whose side is defined by the sidewall 52. The projected portion 53 is formed of a material that is deformable due to a pressing force generated in the event of an engagement with a counterpart member.

The light-emitting device 100 includes, as major components: the substrate 10; the light-emitting element 20; the light-transmissive member 30; a light-reflective member 40; the cover 50; and further a hard-coat layer 60.

Hereinafter, configuration of the light-emitting device 100 will be described.

Substrate

The substrate 10 is a member on which the light-emitting element 20 is disposed and is preferably provided with wiring disposed on a front surface of and/or inside the substrate 10. The substrate 10 is electrically connected with the light-emitting element 20 by connecting the wiring with a pair of positive and negative electrodes of the light-emitting element 20 via a conductive bonding member.

The substrate 10 is preferably formed of a material that has insulation properties, hardly transmits light emitted from the light-emitting element 20 and/or external light, and has a certain strength. Specifically, the substrate 10 can be formed of a ceramics such as alumina, aluminum nitride, and mullite, or formed of a resin such as a phenolic resin, epoxy resin, polyimide resin, bismaleimide triazine (BT) resin, or polyphthalamide. The substrate 10 may be a glass epoxy substrate, a metal substrate, or a partially insulated metal substrate.

Light-Emitting Element

The light-emitting element 20 is disposed on the substrate 10. The light-emitting element 20 has the light extraction surface and a lower surface opposite to the light extraction surface, preferably has the pair of positive and negative electrodes on the lower surface, and is preferably flip-chip mounted on the substrate 10. Although the light-emitting element 20 normally has the shape of a quadrilateral in plan view, it may have the shape of a circle, oval, triangle, hexagon or any other polygon in plan view. In addition, although the element structure 1 made up of the light-emitting element 20, the light-transmissive member 30, and the light-reflective member 40 also normally has the shape of a quadrilateral in plan view, it may have the shape of a circle, oval, triangle, hexagon or any other polygon in plan view.

The light-emitting element 20 is preferably formed of a semiconductor, examples of which include Group III-V compound semiconductors and Group II-VI compound semiconductors. As the semiconductor, a nitride-based semiconductor such as $In_XAl_YGa_{1-X-Y}N$ ($0 \leq X$, $0 \leq Y$, $X+Y \leq 1$) is preferably used. InN, AlN, GaN, InGaN, AlGaN, InGaAlN and the like can also be used.

Light-Transmissive Member

The light-transmissive member 30 is disposed on the upper surface, i.e., the light extraction surface, of the light-emitting element 20. The light-transmissive member 30 protects the light-emitting element 20 from external forces, dust, moisture, and the like, and improves the heat resistant properties, weather resistant properties, and light resistant properties of the light-emitting element 20. Examples of the material of the light-transmissive member 30 include thermosetting resins, thermoplastic resins, modified resins of these resins, and hybrid resins that contain one or more of these resins. Specifically, the examples include epoxy resin, modified epoxy resins, silicone resins, modified silicone resins, and hybrid silicone resins.

The light-transmissive member 30 preferably contains a wavelength conversion material, such as a phosphor that converts the wavelength of light from the light-emitting element 20, to adjust the color of the light to be emitted. Preferably, a cerium-activated yttrium aluminum garnet (YAG)-based fluorescent material is used as the phosphor. The light-transmissive member 30 may contain a filler (e.g., a diffusing agent, a coloring agent, or the like). Preferable examples of the filler include silica, titanium oxide, zirconium oxide, magnesium oxide, glass, a crystal or sintered body of a phosphor, and a sintered body of a phosphor and an inorganic binding material.

Light-Reflective Member

The light-reflective member 40 covers the lateral surface of the light-emitting element 20 and the lateral surface of the light-transmissive member 30 but does not cover the upper surface of the light-transmissive member 30. The light-reflective member 40 serves to improve the light extraction efficiency and is preferably formed of a synthetic resin such as a silicone resin containing a white pigment. Preferably, the white pigment is one selected from the group consisting of titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, zirconium oxide, and silicon oxide, or is a combination of two or more materials selected from the foregoing group.

Cover

The cover 50 covers the light-emitting element 20 with a gap therebetween. The cover 50 includes the upper portion 51 allowing the light emitted from the light-emitting element 20 to transmit; the sidewall 52, which extends along a peripheral edge of the upper portion 51; and the recess 54, whose bottom is defined by the upper portion 51 and whose side is defined by the sidewall 52, and which is open toward the substrate 10.

The upper portion 51 is located opposed to the light-emitting element 20 with a gap therebetween, and serves to refract and transmit the light from the light-emitting element 20 to be emitted within a desired angle of view. The external shape of the upper portion 51 is preferably circle or oval in plan view, or may be a polygon such as a quadrilateral or hexagon.

The upper portion 51 has a lower surface opposed to the light-emitting element 20. The lower surface preferably includes a Fresnel lens surface 5 composed of a plurality of annular projections 7. The upper portion 51 may be a convex lens or a concave lens. The Fresnel lens surface 5 of the upper portion 51 preferably includes: a central projection 6 that is convex toward the light-emitting element 20; and a plurality of annular projections 7 formed around and concentrically with the central projection 6 and being convex toward the light-emitting element 20. Preferably, each of the plurality of annular projections 7 is located concentrically with the central projection 6 in plan view and is formed in an annular shape following the shape of the central projection 6. More specifically, when the central projection 6 is circular in plan view, each of the plurality of projections 7 is formed in the shape of a circular ring in plan view; and when the central projection 6 is rectangular in plan view, each of the plurality of projections 7 is formed in the shape of a rectangular ring in plan view. Preferably, each of the plurality of projections 7 is formed to provide the function of the Fresnel lens surface 5, which refracts the light from the light-emitting element 20. Preferably, the Fresnel lens surface 5 is dimensioned to include the element structure 1 completely in plan view.

The upper portion 51 has a flat configuration on the opposite side of the Fresnel lens surface 5 of the upper portion 51. As an example, the sidewall 52 is formed continuously with the lateral side of the upper portion 51 in a cylindrical shape. Preferably, the cover 50 is fixed to the substrate 10 by the lower surface of the sidewall 52 being fixed to the upper surface of the substrate 10 with an adhesive member therebetween. Here, the adhesive member may be a known adhesive material such as an adhesive tape. As an example, the upper portion 51 and the sidewall 52 of the cover 50 are monolithically formed by processing a single member. Incidentally, the upper portion 51 may be formed of a light-transmissive resin or a glass and the sidewall 52 may be formed of a resin (a resin different from that of the upper portion 51). Examples of the material of the upper portion 51 include thermosetting resins, thermoplastic resins, modified resins of these resins, and hybrid resins that contain one or more of these resins. Specifically, the examples include epoxy resins, modified epoxy resins, silicone resins, modified silicone resins, hybrid silicone resins, and polycarbonate resins. Examples of the material of the upper portion 51 further include hybrid glasses. Examples of the material of the sidewall 52 include thermosetting resins, thermoplastic resins, modified resins of these resins, and hybrid resins that contain one or more of these resins. Specifically, the examples include epoxy resins, modified epoxy resins, silicone resin, modified silicone resins, and hybrid silicone resins. Examples of the material of the sidewall 52 further include hybrid glasses.

The cover 50 has a projected portion 53 on the outer lateral surface of the sidewall 52. The projected portion 53 is formed of a soft material that is deformable due to a pressing force generated in the event of an engagement with a counterpart member. Hear, an example of the counterpart member is a casing 70 used in a mobile phone. The feature of the projected portion 53 being deformable due to a pressing force allows the projected portion 53 to be deformed in such a way as to fix the light-emitting device 100 to the casing 70 when the cover 50 is fitted in a through-hole 71 of the casing 70. The projected portion 53 is deformed such that, when the original height of the projected portion 53 from the sidewall 52 is 1, the height from the sidewall 52 decreases preferably to a height 0.2 to 0.9 times the original height, or more preferably to a height 0.4 to 0.7 times the original height. Such deformation enhances the fixation strength of the cover 50 when it is fitted into the casing 70.

The light-emitting device 100 being fixed to the casing 70 using the projected portion 53 makes it possible to reduce a light-emitting device and illumination device in the thickness.

Hereinbelow, the projected portion 53 is further described taking the casing 70 as an example of the counterpart member.

The projected portion 53 is formed monolithically with the sidewall 52 by molding them together from the same material, for example, from the same soft material.

The soft material used for the projected portion 53 is preferably a silicone resin. Silicone resins are preferable because they are easily deformed due to a pressing force generated in the event of an engagement with the casing 70 and have good light resistant properties and good heat resistant properties.

The projected portion 53 has a cross section with an arc-shaped distal end. This configuration allows the cover 50 to slide smoothly when it is fitted into the casing 70, and thereby the cover 50 is easily fitted into the casing 70. However, the cross-sectional shape of the projected portion 53 can be any other shape so long as the projected portion 53 is deformed due to a pressing force generated in the event of an engagement with the casing 70 and as a result the light-emitting device 100 is fixed to the casing 70. For example, the cross-sectional shape of the projected portion 53 may be a quadrilateral, a triangle, a half circle, or a half oval.

Preferably, the projected portion 53 is formed continuously on the outer lateral surface of the sidewall 52 in a loop shape in plan view. With this configuration, the light-emitting device 100 is easily engaged with the casing 70 in a stable manner. In addition, the projected portion 53 is easily formed on the outer lateral surface of the sidewall 52 in the process of manufacturing the light-emitting device 100.

The projected portion 53 is preferably disposed at such a height position relative to the height of the sidewall 52 that (i) the height position is lower than an uppermost area $\alpha 1$ extending downward from the upper end of the outer lateral surface of the sidewall 52 by a length of 10% of the height of the sidewall 52, and (ii) the height position is higher than a lowermost area $\alpha 2$ extending upward from the lower end of the outer lateral surface of the sidewall 52 by a length of 10% of the height of the sidewall 52. With this configuration, the light-emitting device 100 is easily engaged with the casing 70 in a stable manner.

Hard-Coat Layer

The hard-coat layer 60 covers the upper surface of the cover 50. The hard-coat layer 60 is a member that is harder than the cover 50. The hard-coat layer 60 has light-transmissive properties and continuously covers the upper surface of the upper portion 51 of the cover 50 and the upper surface of the sidewall 52 of the cover 50. The light-emitting device 100 restrains the deformation of the cover 50 by being provided with the hard-coat layer 60. Providing the hard-coat layer 60 protects the upper surface of the cover 50 from external forces, dust, moisture or the like, and inhibits the upper surface from being scratched Examples of the material of the hard-coat layer 60 include thermosetting resins, thermoplastic resins, modified resins of these resins, and hybrid resins that contain one or more of these resins. Specifically, the examples include acrylic resins, epoxy resins, modified epoxy resins, silicone resins, modified silicone resins, hybrid silicone resins, and polycarbonate resins.

Operation of Light-Emitting Device

Next, a description will be given of the operation of the light-emitting device 100.

When the light-emitting device 100 is driven, the light-emitting element 20 is supplied with current from an external power source. As a result, the light-emitting element 20 emits light. The light emitted by the light-emitting element 20 includes light that travels upward, passes through the light-transmissive member 30, comes out of the light-transmissive member 30, and enters the upper portion 51 of the cover 50. The light emitted by the light-emitting element 20 includes light that travels downward, reflects back off the substrate 10, passes through the light-transmissive member 30, comes out of the light-transmissive member 30, and enters the upper portion 51 of the cover 50. The light emitted by the light-emitting element 20 includes light that travels in a lateral direction, reflects back off the light-reflective member 40, passes through the light-transmissive member 30, comes out of the light-transmissive member 30, and enters the upper portion 51 of the cover 50. In the upper portion 51 of the cover 50, the light coming from a central portion of the element structure 1 enters the central projection 6 and exits in the optical axis direction and in the focusing directions. In addition, in the upper portion 51 of the cover 50, the light coming from the element structure 1 other than the central portion thereof enters the projections 7 of the Fresnel lens surface 5 and is refracted at an angle within the desired angle of view. That means, the upper portion 51 of the cover 50 causes the light incident on the projections 7 to be refracted and emitted, thereby to improve the light emission efficiency in the desired angle of view. In this way, the light emitted by the light-emitting element 20 is extracted to the outside of the light-emitting device 100.

Method for Manufacturing Light-Emitting Device

Next, a description will be given of an example of a method for manufacturing the light-emitting device 100.

Figure 2:
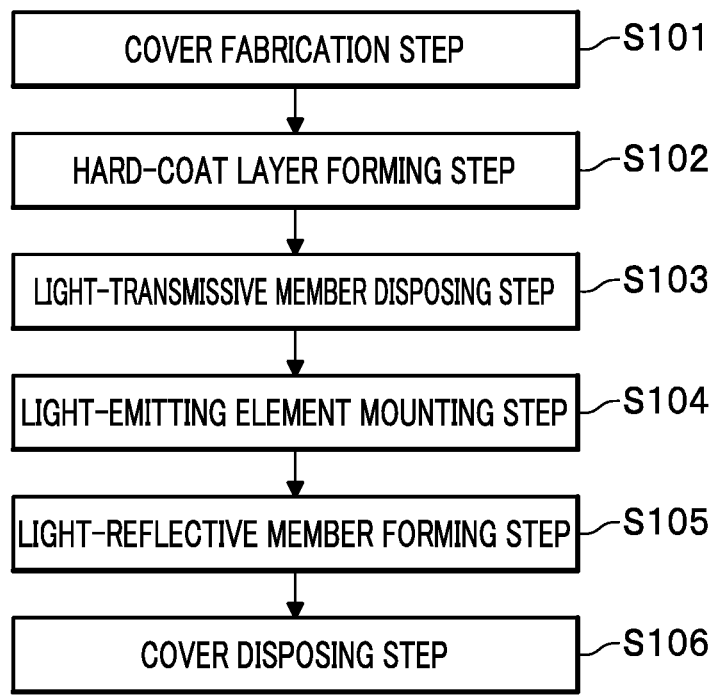
FIG. 2 shows a flowchart of a method for manufacturing the light-emitting device according to the first embodiment.
Figure 3A:
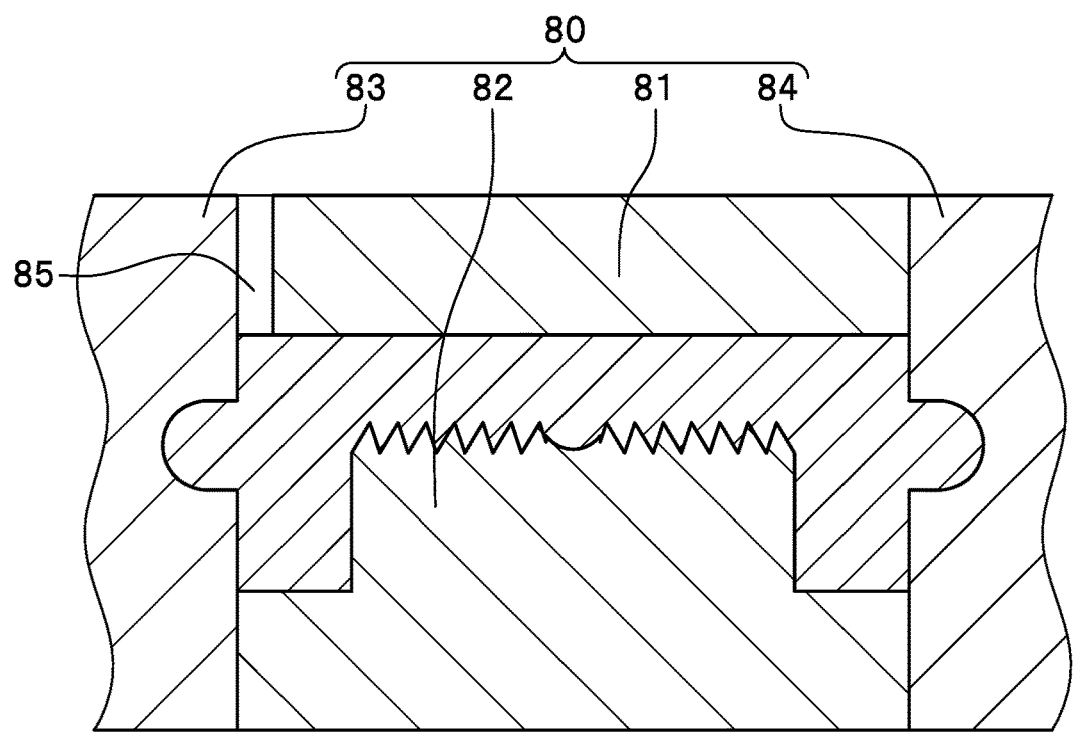
FIG. 3A is a cross-sectional view illustrating a step of fabricating a cover in the method for manufacturing the light-emitting device according to the first embodiment.
Figure 3B:
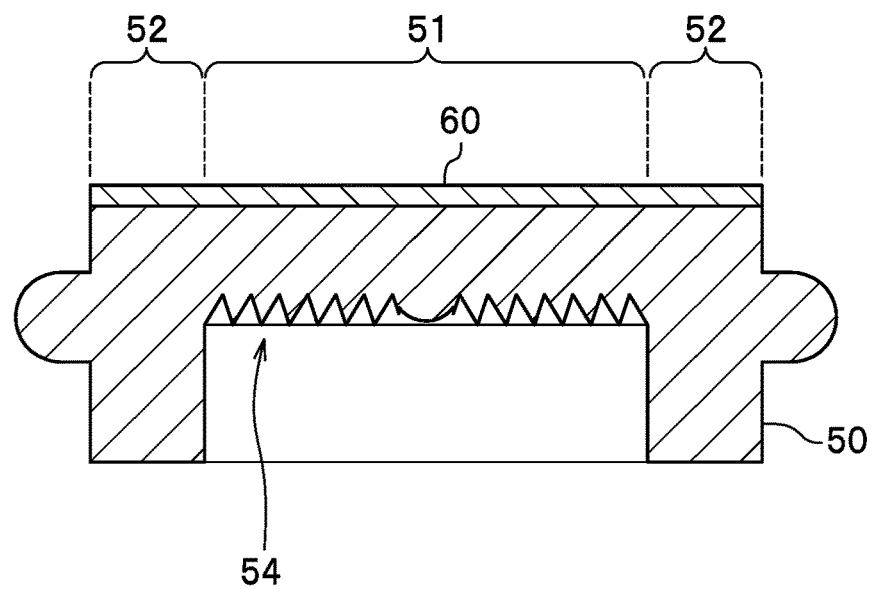
FIG. 3B is a cross-sectional view illustrating a step of forming a hard-coat layer in the method for manufacturing the light-emitting device according to the first embodiment.
Figure 3C:
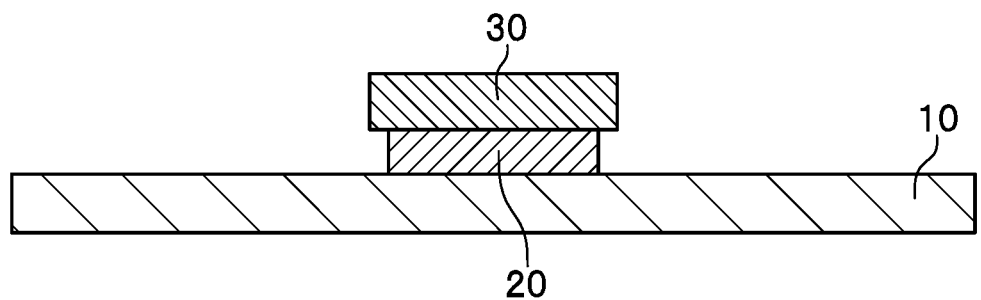
FIG. 3C is a cross-sectional view illustrating a step of disposing a light-emitting element on a substrate in the method for manufacturing the light-emitting device according to the first embodiment.
Figure 3D:
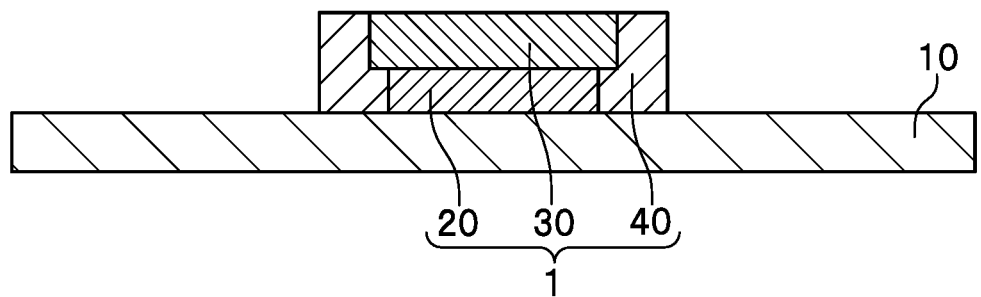
FIG. 3D is a cross-sectional view illustrating a step of forming a light-reflective member in the method for manufacturing the light-emitting device according to the first embodiment.
Figure 3E:
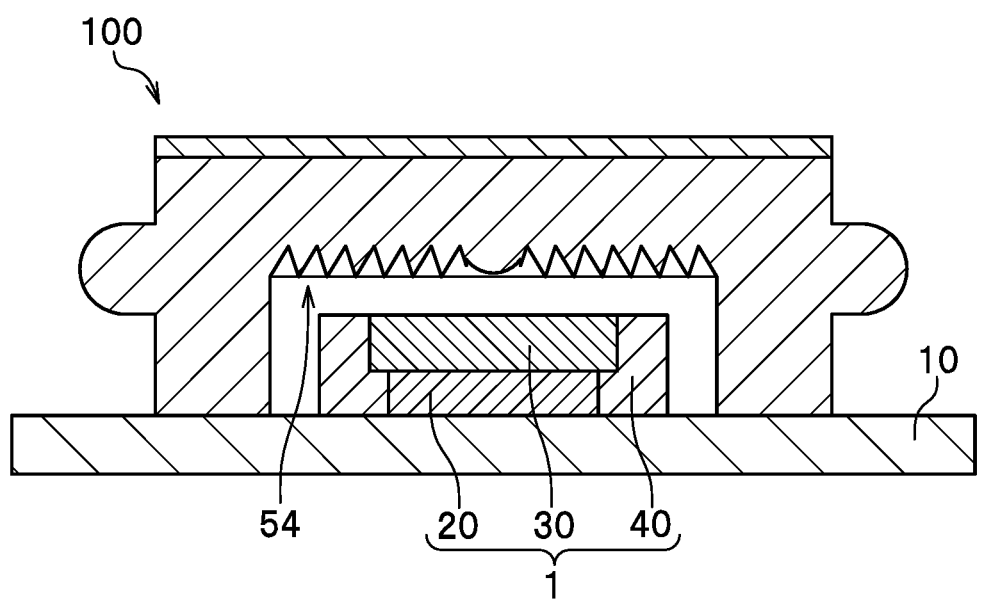
FIG. 3E is a cross-sectional view illustrating a step of disposing the cover in the method for manufacturing the light-emitting device according to the first embodiment.

FIG. 2 shows a flowchart of a method for manufacturing the light-emitting device according to the first embodiment. FIG. 3A is a cross-sectional view illustrating a step of fabricating a cover in the method for manufacturing the light-emitting device according to the first embodiment. FIG. 3B is a cross-sectional view illustrating a step of forming a hard-coat layer in the method for manufacturing the light-emitting device according to the first embodiment. FIG. 3C is a cross-sectional view illustrating a step of disposing a light-emitting element on a substrate in the method for manufacturing the light-emitting device according to the first embodiment. FIG. 3D is a cross-sectional view illustrating a step of forming a light-reflective member in the method for manufacturing the light-emitting device according to the first embodiment. FIG. 3E is a cross-sectional view illustrating a step of disposing the cover in the method for manufacturing the light-emitting device according to the first embodiment. Note that, as it is preferable to dispose a light-emitting element 20 with a light-reflective member 40 on a substrate 10, the step illustrated in FIG. 3C may be omitted to start the manufacturing of the light-emitting device 100 from the step illustrated in FIG. 3D.

A method for manufacturing the light-emitting device 100 includes: a cover fabrication step S101 including injecting a light-transmissive material into a space defined in a molding device 80, hardening or curing the injected light-transmissive material to form a cover 50 including an upper portion 51 and a sidewall 52 extending along a peripheral edge of the upper portion 51, the cover 50 having a recess 54 defined by the upper portion 51 and the sidewall 52, the sidewall 52 having an outer lateral surface on which a projected portion 53 is formed; a hard-coat layer forming step S102 including forming a hard-coat layer 60 on an upper surface of the cover 50; a light-transmissive member disposing step S103 including disposing a light-transmissive member 30 on a light extraction surface of a light-emitting element 20 to be disposed on a substrate 10; a light-emitting element mounting step S104 including mounting the light-emitting element 20 on the substrate 10 so that the light-transmissive member 30 is located on the upper side of the light-emitting element 20; a light-reflective member forming step S105 including forming a light-reflective member 40 that covers the lateral surface of the light-emitting element 20 and the lateral surface of the light-transmissive member 30; and a cover disposing step S106 including disposing the cover 50 so that the light-emitting element 20 is housed in the recess 54.

The projected portion 53, which is formed in the cover fabrication step S101, is formed of a soft material that is deformable due to a pressing force generated in the event of an engagement with a counterpart member.

The materials and arrangement of the members are substantially the same as or similar to those of the above-described light-emitting device 100, and therefore descriptions thereof will be omitted as appropriate.

Cover Fabrication Step

The cover fabrication step S101 includes injecting light-transmissive material into a space defined by a molding device 80 and hardening or curing the injected light-transmissive material. In the step S101, produced as a result of hardening or curing the light-transmissive material is a cover 50 that includes an upper portion 51 and a sidewall 52 extending along the peripheral edge of the upper portion 51. The cover 50 has a recess 54 whose bottom is defined by the upper portion 51 and whose side is defined by the sidewall 52. The cover 50 has a projected portion 53 on an outer lateral surface of the sidewall 52.

In the step S101, an upper mold 81, a lower mold 82, a left mold 83, and a right mold 84, which constitute the molding device 80, are provided. Subsequently, the light-transmissive material is injected into the space defined by the molding device 80 via a resin injection port 85. The light-transmissive material becomes the above-described soft material after being hardened or cured. Subsequently, the light-transmissive material injected into the space is hardened or cured and then the molding device 80 is detached. In this way, the cover 50 is produced. Here, "hardening" means, in a case in which a thermoplastic resin is to be used as the light-transmissive material, cooling the thermoplastic resin having been heated and melted to solidify the thermoplastic resin. Here, "curing" means, in a case in which a thermosetting resin is to be used as the light-transmissive material, heating the thermosetting resin in a liquid state to solidify the thermosetting resin.

Hard-Coat Layer Forming Step

The hard-coat layer forming step S102 includes forming a hard-coat layer 60 on an upper surface of the cover 50.

In the step S102, the hard-coat layer 60 is formed continuously on the upper surface of the upper portion 51 of the cover 50 and the upper surface of the sidewall 52 of the cover 50 by a spray method or by affixing a resin sheet or the like, for example.

Light-Transmissive Member Disposing Step

The light-transmissive member disposing step S103 includes disposing a light-transmissive member 30 on a light extraction surface of a light-emitting element 20 to be disposed on a substrate 10.

In the step S103, for example, the light-transmissive member 30 having a predetermined shape is bonded to the light extraction surface of the light-emitting element 20. In the event of bonding the light-transmissive member 30 to the light-emitting element 20, the light-transmissive member 30 may be directly bonded to the light-emitting element 20 or may be bonded via bonding member with light-transmissive properties. Alternatively, the light-transmissive member 30 may be formed by a spray method.

Light-Emitting Element Mounting Step

The light-emitting element mounting step S104 includes mounting the light-emitting element 20 on the substrate 10 so that the light-transmissive member 30 is located on the upper side of the light-emitting element 20.

The light-emitting element 20 has an electrode formation surface as a mounting surface and is flip-chip mounted on wiring formed on the substrate 10 via a conductive bonding member. Examples of the conductive bonding member include a eutectic solder, a conductive paste, and bumps.

Note that the light-transmissive member disposing step S103 and the light-emitting element mounting step S104 may not necessarily be clearly distinguished. For example, the light-emitting element 20 may be disposed on the substrate 10 and then bonded to the light-transmissive member 30.

Light-Reflective Member Forming Step

The light-reflective member forming step S105 includes forming a light-reflective member 40 that covers the lateral surface of the light-emitting element 20 and the lateral surface of the light-transmissive member 30.

In the step S105, for example, the light-reflective member 40 is formed by supplying resin or the like to-constitute the light-reflective member 40 on the substrate 10 by using a discharge device (dispenser) that is moveable in the up-down direction, in the horizontal direction or the like relative to the substrate 10. Alternatively, the light-reflective member 40 may be formed by compression molding, transfer molding, or the like.

The light-reflective member 40 is preferably formed before the light-emitting element 20 is disposed on the substrate 10. More specifically, it is preferable to dispose the light-transmissive member 30 on the upper surface of the light-emitting element 20, then dispose the light-reflective member 40 on the lateral surface of the light-emitting element 20 and on the lateral surface of the light-transmissive member 30, and then dispose the light-emitting element 20, on which the light-transmissive member 30 and the light-reflective member 40 has been disposed, on the substrate 10. This makes it easy to form the light-emitting element 20 provided with the light-reflective member 40 and reduces the heat transferred to the substrate 10 and reduces the pressure applied to the substrate 10.

Cover Disposing Step

The cover disposing step S106 includes disposing the cover 50 so that the light-emitting element 20 is housed in the recess 54.

In the step S106, a lower surface of the sidewall 52 of the cover 50 is fixed to the upper surface of the substrate 10 with an adhesive member therebetween. As a result, the light-emitting element 20 is housed in the recess 54 of the cover 50.

Illumination Device

Figure 4:
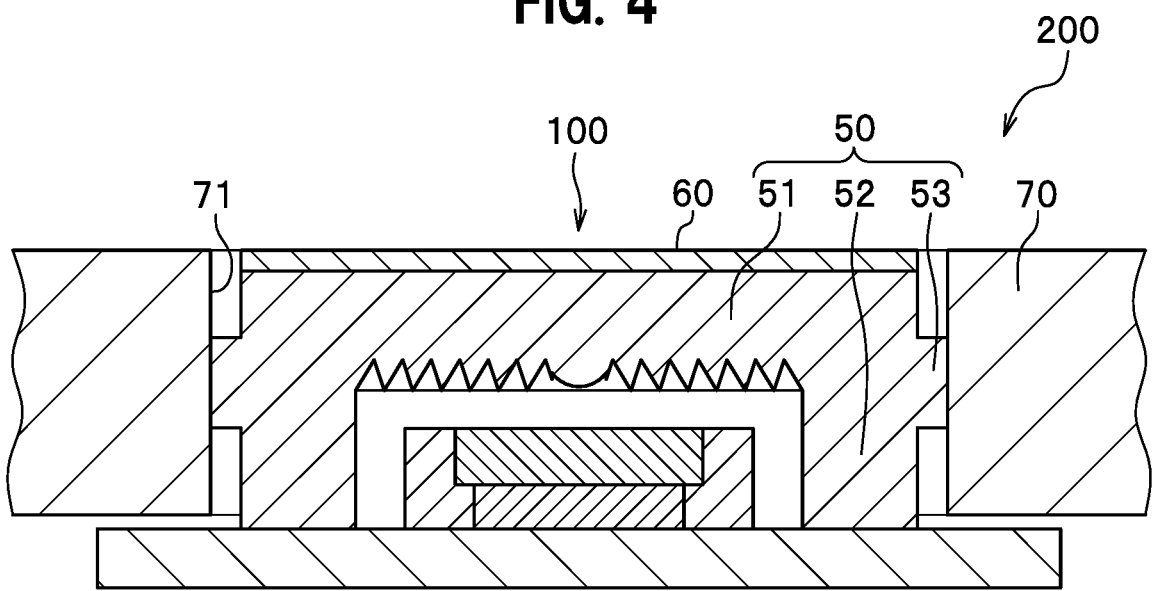
FIG. 4 is a cross-sectional view schematically illustrating the configuration of an illumination device according to the first embodiment.

FIG. 4 is a cross-sectional view schematically illustrating the configuration of an illumination device according to the first embodiment.

The illumination device 200 according to the first embodiment includes the above-described light-emitting device 100 and a counterpart member constituted by a casing 70 having a through-hole 71. The light-emitting device 100 is fixed to the casing 70 of the illumination device 200 by the projected portion 53 of the light-emitting device 100 being in contact with the inner surface of the through-hole 71 of the casing 70 in a state of being deformed.

The light-emitting device 100 is structured as described above.

Casing

The casing 70 has the through-hole 71. The casing 70 is a member to which the light-emitting device 100 is to be fixed. The casing 70 may be a part of the casing of a mobile phone that employs the light-emitting device 100 as a flashlight light source.

The size of the through-hole 71 is larger than the size of the cover 50 in plan view such that the upper surface of the cover 50, which is the upper surface of the hard-coat layer 60, is exposed. The size of the through-hole 71 is smaller than the size of the light-emitting device 100 including the size of the projected portion 53 in plan view. With this structure, in the illumination device 200, the projected portion 53 is in contact with the inner surface of the through-hole 71 of the casing 70 and is deformed by being pressed due to the pressure from the inner surface, and whereby the light-emitting device 100 is fixed to the casing 70. The casing 70 is preferably formed of a light-blocking material. To restrict the light distributing angle by which the light emitted from the light-emitting device 100 is to be distributed, the casing 70 is preferably formed of a light-reflective resin in which a filler is contained to reflect light, a light-absorbing resin that absorbs light, or the like. Preferably, the through-hole 71 has the shape of a circle, oval, triangle, quadrilateral, hexagon or the like in plan view.

Method of Manufacturing Illumination Device

Next, a description will be given of an example of a method for manufacturing the illumination device 200.

Figure 5:
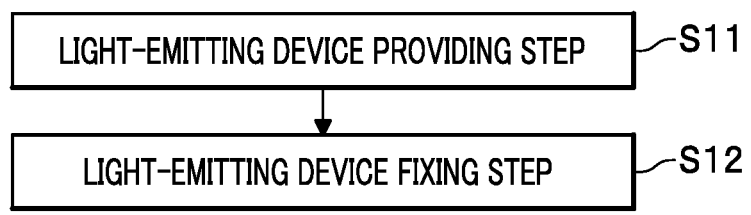
FIG. 5 shows a flowchart of a method for manufacturing the illumination device according to the first embodiment.

FIG. 5 shows a flowchart of a method for manufacturing the illumination device according to the first embodiment.

The method for manufacturing the illumination device 200 includes: a light-emitting device providing step S11 including providing a light-emitting device 100 using the method for manufacturing the light-emitting device 100; and a light-emitting device fixing step S12 including fixing the light-emitting device 100 in the counterpart member, which is constituted by the casing 70 having the through-hole 71, so that the projected portion 53 of the light-emitting device 100 comes in contact with the inner surface of the through-hole 71 of the casing 70 in a state of being deformed.

The materials and arrangement of the members are substantially the same as or similar to those of the above-described illumination device 200, and therefore descriptions thereof will be omitted as appropriate.

Light-Emitting Device Providing Step

The light-emitting device providing step S11 includes providing the light-emitting device 100 using the above-described method for manufacturing the light-emitting device 100.

In the step S11, the light-emitting device 100 is manufactured by carrying out steps S101 to S106 described above.

Light-Emitting Device Fixing Step

The light-emitting device fixing step S12 includes fixing the light-emitting device 100 in a counterpart member, constituted by the casing 70 having the through-hole 71, so that the projected portion 53 of the light-emitting device 100 comes in contact with the inner surface of the through-hole 71 of the casing 70 in a state of being deformed.

In the step S12, the light-emitting device 100 is engaged with casing 70 by inserting the light-emitting device 100 into the through-hole 71 of the casing 70 in such a manner that the upper portion 51 of the cover 50 is inserted earlier and that the projected portion 53 is brought into contact with the inner surface of the through-hole 71 of the casing 70. In this event, as the projected portion 53 is formed of a soft material that is deformable due to a pressing force generated in the event of the engagement with the casing 70, the projected portion 53 gets deformed when being brought into contact with the inner surface of the through-hole 71 of the casing 70, and as a result, the light-emitting device 100 is fixed in the casing 70.

Incidentally, for example, the casing 70 may be constituted by an upper member having the through-hole 71 and a lower member. In this case, the light-emitting device 100 is first inserted into the through-hole 71 from the lower side of the upper member, and then, the upper member and the lower member are joined.

Second Embodiment

Light-Emitting Device

Figure 6A:
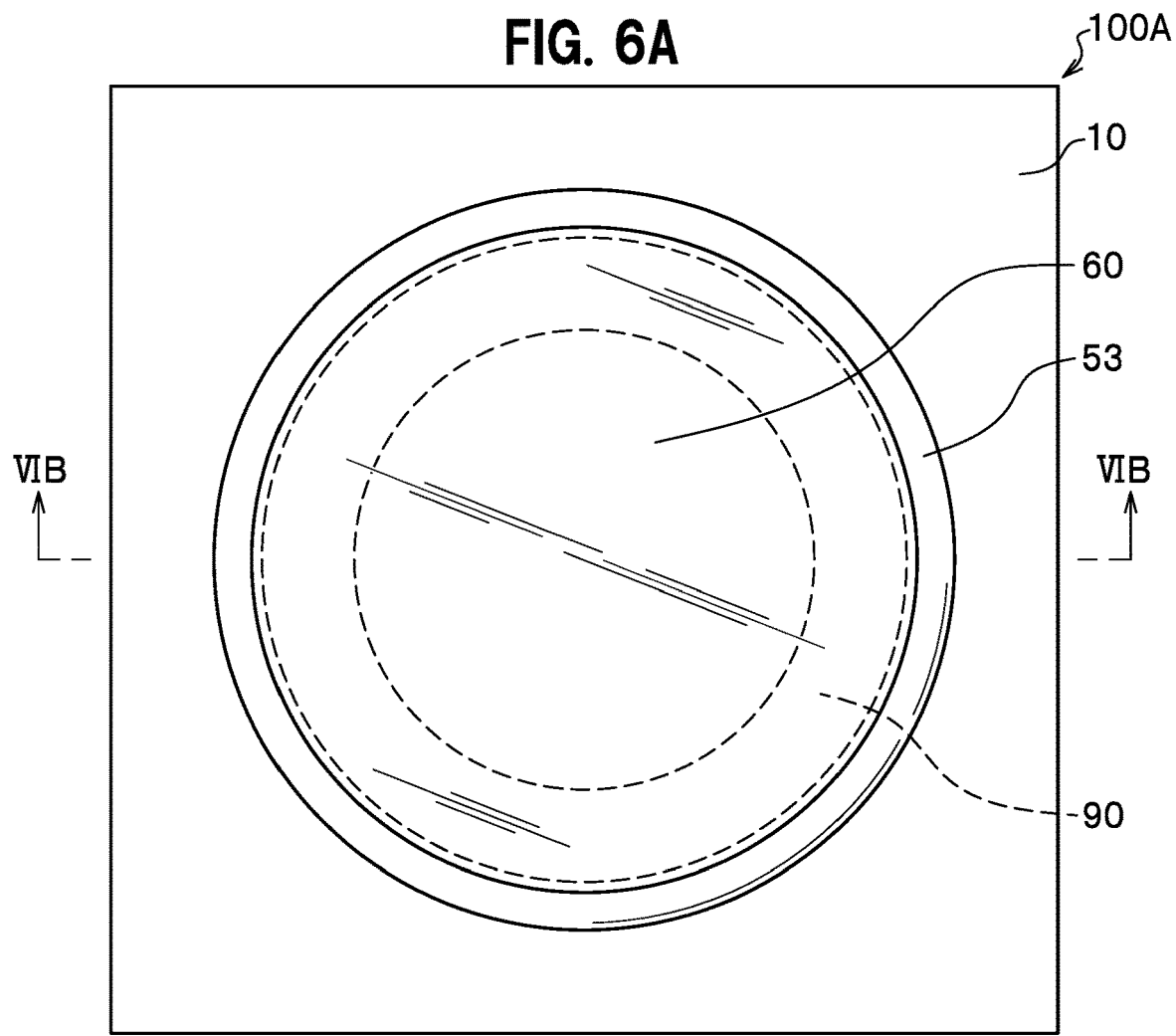
FIG. 6A is a plan view schematically illustrating the configuration of a light-emitting device according to a second embodiment.
Figure 6B:
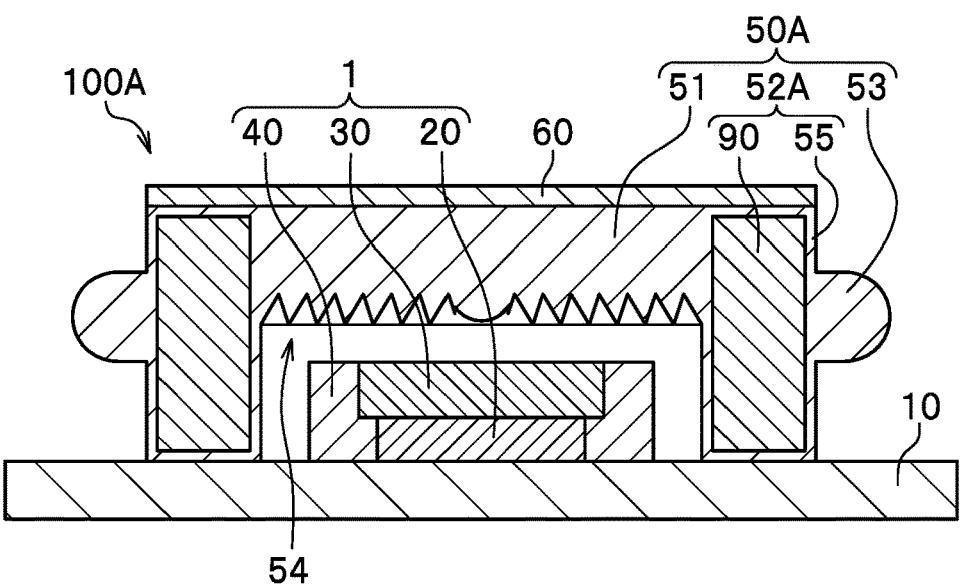
FIG. 6B is a cross-sectional view taken along line VIB-VIB in FIG. 6A.

FIG. 6A is a plan view schematically illustrating the configuration of a light-emitting device according to a second embodiment. FIG. 6B is a cross-sectional view taken along line VIB-VIB in FIG. 6A.

The light-emitting device 100A according to the second embodiment includes: a substrate 10; a light-emitting element 20 disposed on the substrate 10; a light-transmissive member 30 disposed on a light extraction surface of the light-emitting element 20; and a cover 50A that covers the light-emitting element 20 with a gap between the cover 50A and the light-emitting element 20. The cover 50A includes: an upper portion 51 which is transmissive to the light from the light-emitting element 20; a sidewall 52A extending along the periphery edge of the upper portion 51; and a recess 54 whose bottom is defined by the upper portion 51 and whose side is defined by the sidewall 52A. The sidewall 52A has an outer lateral surface on which a projected portion 53 is formed. The sidewall 52a includes an internal part 90 and an outer part 55 that encapsulates the internal part 90A. The projected portion 53 is formed of a soft material that is deformable due to a pressing force generated in the event of an engagement with a counterpart member. The internal part 90 is formed of a hard material harder than the soft material.

The light-emitting device 100A includes, as main components: the substrate 10; the light-emitting element 20; the light-transmissive member 30; the light-reflective member 40; the cover 50A; the hard-coat layer 60; the internal part 90; and the outer part 55.

Hereinafter, configuration of the light-emitting device 100A will be described focusing the features thereof different from those of the light-emitting device 100.

The sidewall 52A of the light-emitting device 100A includes the internal part 90 and the outer part 55 encapsulating the internal part 90. The internal part 90 is embedded in the sidewall 52A. The internal part 90 is formed of a hard material that is harder than the soft material of which the projected portion 53 is made. The outer part 55 is formed of the same soft material as the material of the projected portion 53 and is formed monolithically with the projected portion 53. The outer part 55 constitutes the sidewall 52A except the internal part 90 and the projected portion 53.

The hard material used for the internal part 90 only needs to be harder than the outer part 55. Examples of the material of the internal part 90 include polycarbonate resins, epoxy resins, and hybrid glasses. Preferably, the hard material is a polycarbonate resin. Polycarbonate resins are preferable in terms of the easiness in processing and appropriate hardness.

The cover 50A of the light-emitting device 100A, in particular the upper portion 51, can be inhibited from being deformed by the sidewall 52A including the internal part 90. As a result, it is possible to reduce the variation in the irradiation pattern due to the deformation of the lens.

As an example, the internal part 90 is formed in a cylindrical shaped in conformance with the shape of the sidewall 52A. The internal part 90 has a height slightly less than the height of the sidewall 52A. The internal part 90 may be formed intermittently in conformance with the shape of the sidewall 52A in plan view and may have a height that is about two-thirds or half the height of the sidewall 52A.

Method for Manufacturing Light-Emitting Device

Next, a description will be given of an example of a method for manufacturing the light-emitting device 100A.

The method for manufacturing the light-emitting device 100A includes, in the cover fabrication step S101 of the method for manufacturing the light-emitting device 100, placing a hard member that is harder than the soft material at a position where the sidewall 52A is formed in the space defined in the molding device 80. Except this matter, the method for manufacturing the light-emitting device 100A is substantially the same as or similar to the method for manufacturing the light-emitting device 100 according to the first embodiment. Hereinbelow, a description will be given of the cover fabrication step of the method for manufacturing the light-emitting device 100A.

The cover fabrication step of the method for manufacturing the light-emitting device 100A includes placing a hard member that is harder than the soft material at a position where the sidewall 52A is formed in the space defined in the molding device 80. The cover fabrication step of the method for manufacturing the light-emitting device 100A includes injecting light-transmissive material into the space defined by the molding device 80 and hardening or curing the injected light-transmissive material. In this step, produced as a result of hardening or curing the light-transmissive material is a cover 50A that includes an upper portion 51 and a sidewall 52A extending along the peripheral edge of the upper portion 51 and having an internal part 90 in the sidewall 52A. The cover 50A has a recess 54 whose bottom is defined by the upper portion 51 and whose side is defined by the sidewall 52A. The cover 50A has a projected portion 53 on an outer lateral surface of the sidewall 52A.

In the cover fabrication step of the method for manufacturing the light-emitting device 100A, after placing the hard member at a position where the sidewall 52A is formed in the space defined in the molding device 80, the light-transmissive material is injected into the space.

Specifically, the hard member is the internal part 90.

Other matters are substantially the same as or similar to those in the step of fabricating the cover in the method for manufacturing the light-emitting device 100.

Illumination Device

Figure 7:
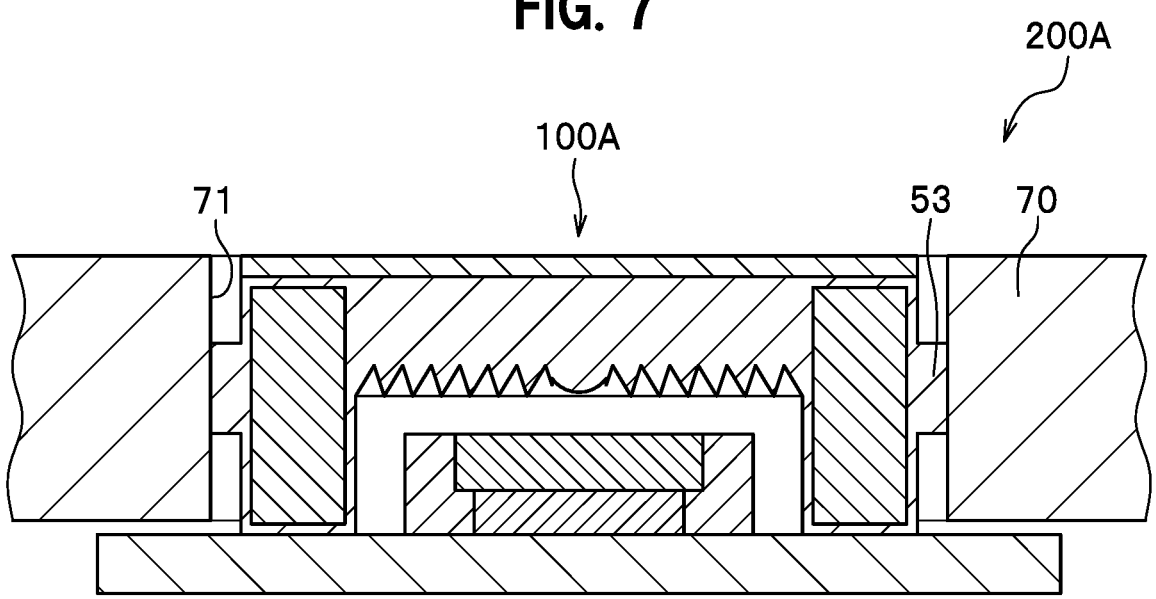
FIG. 7 is a cross-sectional view schematically illustrating the configuration of an illumination device according to the second embodiment.

FIG. 7 is a cross-sectional view schematically illustrating the configuration of an illumination device according to the second embodiment.

An illumination device 200A according to the second embodiment includes the above-described light-emitting device 100A and a counterpart member constituted by a casing 70 having a through-hole 71. The light-emitting device 100A is fixed to the casing 70 of the illumination device 200A by the projected portion 53 of the light-emitting device 100A being in contact with the inner surface of the through-hole 71 of the casing 70 in a state of being deformed.

The illumination device 200A is substantially the same as or similar to the illumination device 200 according to the first embodiment except that the above-described light-emitting device 100A is used in place of the light-emitting device 100.

Method of Manufacturing Illumination Device

Next, a description will be given of an example of a method for manufacturing the illumination device 200A.

The method for manufacturing the illumination device 200A is substantially the same as or similar to the method for manufacturing the illumination device 200 according to the first embodiment except that the light-emitting device 100A provided by the above-described method for manufacturing the light-emitting device 100A is used in place of the light-emitting device 100.

In the foregoing, the light-emitting devices, the illumination devices, and the methods for manufacturing them have been specifically described in reference to the embodiments of the inventions. The scope of the present invention is not limited thereto and should be construed broadly on the basis of the scope of claims. In addition, various modifications and variations made on the basis of the above description are also included in the scope of the present invention.

Other Embodiment

Figure 8:
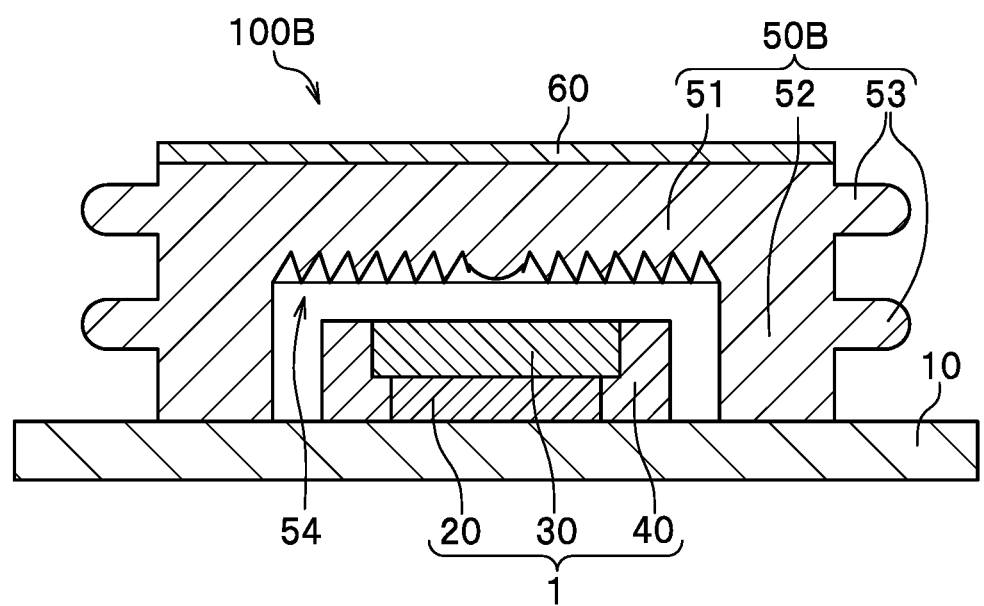
FIG. 8 is a cross-sectional view schematically illustrating the configuration of a light-emitting device according to another embodiment.

FIG. 8 is a cross-sectional view schematically illustrating the configuration of a light-emitting device according to another embodiment.

A light-emitting device 100B has a cover 50B with a sidewall 52 on which two loop-shaped projected portions 53 is formed side-by-side in the height direction of the sidewall 52. With this configuration, the light-emitting device 100B can be more stably engaged with the casing. More in general, the light-emitting device and the illumination device may have a plurality of loop-shaped projected portions 53 arranged side-by-side in the height direction of the sidewall 52.

Incidentally, when a plurality of projected portions 53 are to be arranged, it is preferable that at least one of the plurality of projected portions 53 is disposed at such a height position relative to the height of the sidewall 52 that (i) the height position is lower than an uppermost area extending downward from the upper end of the outer lateral surface of the sidewall 52 by a length of 10% of the height of the sidewall 52, and (ii) the height position is higher than a lowermost area extending upward from the lower end of the outer lateral surface of the sidewall 52 by a length of 10% of the height of the sidewall 52. Moreover, it is more preferable that all the plurality of projected portions 53 are each disposed at a height position lower than the uppermost area and higher than the lowermost area. With this configuration, the light-emitting device is easily engaged with the casing in a stable manner.

Moreover, for example, the light-emitting device and/or the light-emitting device of the illumination device may or may not be provided with the hard-coat layer. Moreover, the light-emitting device and/or the light-emitting device of the illumination device may or may not be provided with the light-reflective member.

Moreover, the upper portion of the cover of the light-emitting device and the upper portion of the cover of the light-emitting device of the illumination device may include: an internal part formed of a hard material harder than the soft material; and an outer part that encapsulates the internal part.

The method of manufacturing the light-emitting device and the method of manufacturing the illumination device may include another step or other steps between two of, or before or after one of the above-described steps, so long as the another step or the other steps do not adversely affect the above-described steps. For example, a step of removing foreign matter mixed in the process of manufacturing may be inserted in the process steps.

It should be noted that some of the steps of the method for manufacturing the light-emitting device and the method of manufacturing the illumination device are not limited to the order as described. The order in which they are carried out may be changed. For example, the cover fabrication step may be carried out after the light-transmissive member disposing step, after the light-emitting element mounting step, or after the light-reflective member forming step. In addition, the hard-coat layer forming step may be carried out after the light-transmissive member disposing step, after the light-emitting element mounting step, after the light-reflective member forming step, or after the cover disposing step.

The light-emitting devices and the illumination devices according to the embodiments described above can be used for lighting purposes in flashlight light sources or the like of mobile phones and cameras.

What is claimed is:

1. A light-emitting device comprising:
   a substrate;
   a light-emitting element disposed on the substrate;
   a light-transmissive member disposed on a light extraction surface of the light-emitting element; and
   a cover that covers the light-emitting element with a gap between the cover and the light-emitting element, the cover comprising:
      an upper portion that is transmissive to light coming from the light-emitting element,
      a sidewall extending along a peripheral edge of the upper portion and having an outer lateral surface,
      a projected portion that is monolithic with the sidewall and projects from the outer lateral surface of the sidewall, and
      a recess defined by the upper portion and the sidewall,
   wherein the projected portion is formed of a material that is deformable due to a pressing force generated in the event of an engagement with a counterpart member.

2. The light-emitting device according to claim 1, wherein the material of the projected portion is a silicone resin.

3. The light-emitting device according to claim 1, wherein the upper portion of the cover comprises a Fresnel lens surface.

4. The light-emitting device according to claim 3, wherein the Fresnel lens surface includes:
   a central projection that is convex toward the light-emitting element; and
   a plurality of annular projections that are formed around and concentrically with the central projection and are convex toward the light-emitting element.

5. The light-emitting device according to claim 1, wherein, in a plan view, the projected portion extends continuously along the outer lateral surface of the sidewall in a loop shape.

6. The light-emitting device according to claim 1, wherein the projected portion is located at such a height position relative to a height of the sidewall that (i) the height position is lower than an uppermost area extending downward from an upper end of the outer lateral surface of the sidewall by a length of 10% of the height of the sidewall, and (ii) the height position is higher than a lowermost area extending upward from a lower end of the outer lateral surface of the sidewall by a length of 10% of the height of the sidewall.

7. An illumination device comprising:
   the light-emitting device according to claim 1, and
   a casing having a through-hole, the casing being the counterpart member,
   wherein the light-emitting device is fixed to the casing by the projected portion of the light-emitting device being in contact with an inner surface of the through-hole of the casing in a state of being deformed.

8. The light-emitting device according to claim 1, wherein the outer surface of the sidewall from which the projected portion projects in an outermost lateral surface of the sidewall.

9. The light-emitting device according to claim 1, wherein, in a side cross-sectional view, the outer lateral surface of the sidewall from which the projected portion projects extends in a straight line from an uppermost surface of the cover to a lowermost surface of the cover.

10. The light-emitting device according to claim 1, wherein, in a side cross-sectional view, a first portion of the outer lateral surface of the sidewall extends linearly from an upper end of the projected portion to an uppermost surface of the cover, and a second portion of the outer lateral surface of the sidewall extends linearly from a lower end of the projected portion to a lowermost surface of the cover.

11. The light-emitting device according to claim 1, wherein the projected portion is deformable such that, upon deformation, a height of the projected portion from the sidewall decreases to a height 0.2 to 0.9 times an original height of the projected portion from the sidewall.

12. The light-emitting device according to claim 1, wherein the recess opens toward the substrate.

13. The light-emitting device according to claim 1, wherein the upper portion of the cover has a bottom surface facing the light-emitting element,
   wherein a height of a lower end of the projected portion from the substrate is lower than a height of the bottom surface of the upper portion of the cover from the substrate.

14. The light-emitting device according to claim 1, wherein the projected portion has a cross section with an arc-shaped distal end.

15. A light-emitting device comprising:
   a substrate;
   a light-emitting element disposed on the substrate;
   a light-transmissive member disposed on a light extraction surface of the light-emitting element; and
   a cover that covers the light-emitting element with a gap between the cover and the light-emitting element, the cover comprising:
      an upper portion that is transmissive to light coming from the light-emitting element,
      a sidewall extending along a peripheral edge of the upper portion and having an outer lateral surface on which a projected portion is formed, and
      a recess defined by the upper portion and the sidewall,
   wherein the sidewall comprises an internal part, and an outer part encapsulating the internal part,
   wherein the projected portion is formed of a material that is deformable due to a pressing force generated in the event of an engagement with a counterpart member, and
   wherein the internal part is formed of a material harder than the material of the projected portion.

16. The light-emitting device according to claim 15, wherein the material of the internal part is a polycarbonate resin.

17. The light-emitting device according to claim 15, wherein the outer surface of the sidewall from which the projected portion projects in an outermost lateral surface of the sidewall.

18. The light-emitting device according to claim 15, wherein, in a side cross-sectional view, the outer lateral surface of the sidewall from which the projected portion projects extends in a straight line from an uppermost surface of the cover to a lowermost surface of the cover.

19. The light-emitting device according to claim 15, wherein, in a side cross-sectional view, a first portion of the outer lateral surface of the sidewall extends linearly from an upper end of the projected portion to an uppermost surface of the cover, and a second portion of the outer lateral surface of the sidewall extends linearly from a lower end of the projected portion to a lowermost surface of the cover.

20. The method according to claim 15, wherein the projected portion is monolithic with the sidewall.

21. The light-emitting device according to claim 15, wherein the material of the projected portion is a silicone resin.

22. The light-emitting device according to claim 15, wherein the upper portion of the cover comprises a Fresnel lens surface.

23. The light-emitting device according to claim 22, wherein the Fresnel lens surface includes:
    a central projection that is convex toward the light-emitting element; and
    a plurality of annular projections that are formed around and concentrically with the central projection and are convex toward the light-emitting element.

24. The light-emitting device according to claim 15, a height of the internal part of the sidewall is less than a height of the sidewall.

25. A method for manufacturing a light-emitting device, the method comprising steps of:
    forming a cover, which comprises:
        injecting a light-transmissive material into a space defined in a molding device, and
        hardening or curing the injected light-transmissive material,
    wherein the formed cover comprises:
        an upper portion,
        a sidewall extending along a peripheral edge of the upper portion and having an outer lateral surface,
        a projected portion that is monolithic with the sidewall and projects from the outer lateral surface of the sidewall, and
        a recess defined by the upper portion and the sidewall;
    disposing a light-transmissive member on a light extraction surface of a light-emitting element to be disposed on a substrate; and
    disposing the cover so that the light-emitting element is housed in the recess,
    wherein the projected portion is formed of a material that is deformable due to a pressing force generated in the event of an engagement with a counterpart member.

26. The method according to claim 25, wherein the step of forming the cover comprises placing a member harder than the material of the projected portion at a position where the sidewall is to be formed in the space.

27. A method for manufacturing an illumination device, the method comprising steps of:
    manufacturing a light-emitting device in accordance with the method of claim 25, and
    fixing the light-emitting device to a casing having a through-hole and constituting the counterpart member so that the projected portion of the light-emitting device comes into contact with an inner surface of the through-hole of the casing in a state of being deformed.

28. The method according to claim 25, wherein the outer surface of the sidewall from which the projected portion projects in an outermost lateral surface of the sidewall.

29. The method according to claim 25, wherein, in a side cross-sectional view, the outer lateral surface of the sidewall from which the projected portion projects extends in a straight line from an uppermost surface of the cover to a lowermost surface of the cover.

30. The method according to claim 25, wherein, in a side cross-sectional view, a first portion of the outer lateral surface of the sidewall extends linearly from an upper end of the projected portion to an uppermost surface of the cover, and a second portion of the outer lateral surface of the sidewall extends linearly from a lower end of the projected portion to a lowermost surface of the cover.

* * * * *